United States Patent [19]
DeMaso et al.

[11] Patent Number: 5,206,463
[45] Date of Patent: Apr. 27, 1993

[54] COMBINED RIGID AND FLEXIBLE PRINTED CIRCUITS AND METHOD OF MANUFACTURE

[75] Inventors: Arthur J. DeMaso, Pepperell, Mass.; Thomas H. Stearns, Nashua, N.H.

[73] Assignee: Miraco, Inc., Nashua, N.H.

[21] Appl. No.: 676,877

[22] Filed: Mar. 28, 1991

Related U.S. Application Data

[63] Continuation-in-part of Ser. No. 557,526, Jul. 24, 1990.

[51] Int. Cl.⁵ .............................................. H05K 1/00
[52] U.S. Cl. .................................. 174/254; 174/262; 428/901; 29/852
[58] Field of Search .................. 174/254, 262, 255; 361/398, 414, 411; 428/138, 901, 209, 626; 156/630; 29/852

[56] References Cited

U.S. PATENT DOCUMENTS

| | | | |
|---|---|---|---|
| 4,661,417 | 4/1987 | Suzuki | 428/626 X |
| 4,800,461 | 8/1989 | Dixon et al. | 361/398 X |
| 4,931,134 | 6/1990 | Hatkevitz et al. | 174/254 X |
| 4,997,702 | 3/1991 | Gazit et al. | 174/254 X |
| 5,004,639 | 4/1991 | Desai | 361/398 X |

Primary Examiner—Leo P. Picard
Assistant Examiner—Trinidad Korka
Attorney, Agent, or Firm—Davis, Bujold & Streck

[57] ABSTRACT

This is a printed circuit comprising multiple layers and rigid and flexible portions and including a sheet of flexible substrate material extending over the entirety of the rigid and flexible portions and paths of conductive material carried by at least one side of the sheet of flexible substrate material with a sheet of flexible over-layer material extending over at least the entirety of the conductors in all the flexible portions. A flexible adhesive material may adhesively attach the sheet of flexible over-layer material to the entirety of all the flexible portions and a rigid substrate material extends over the entirety of all the rigid portions. A rigid adhesive material may adhesively attach the sheets of a rigid substrate material to the entirety of all the rigid portions. The rigid adhesive attaching the rigid substrate material to the rigid portions may extend out over the edge of the rigid portions onto the flexible portions to form a protective edge. The sheet of flexible over-layer material may also extend over the rigid portions and be attached with a rigid adhesive.

18 Claims, 4 Drawing Sheets

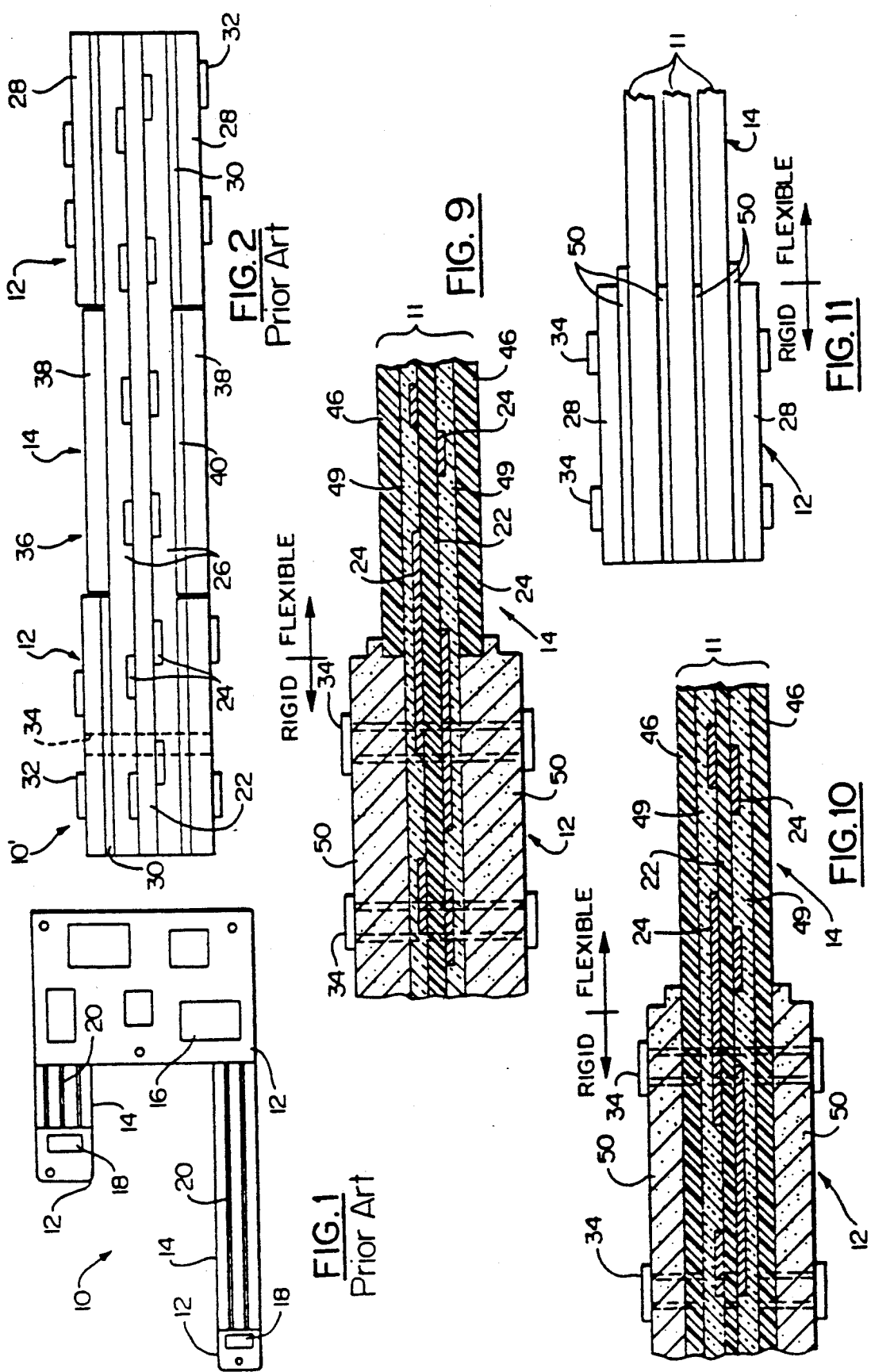

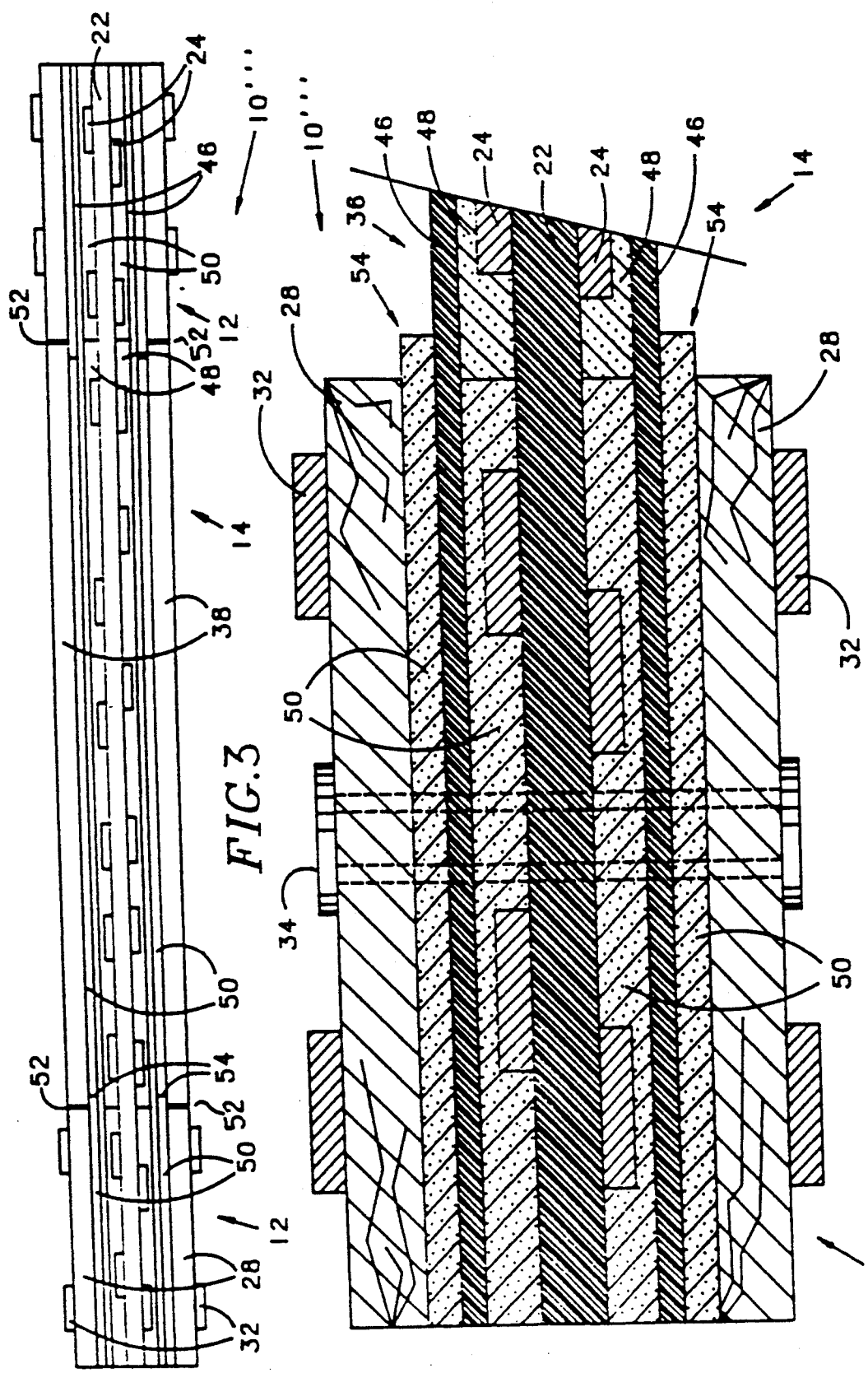

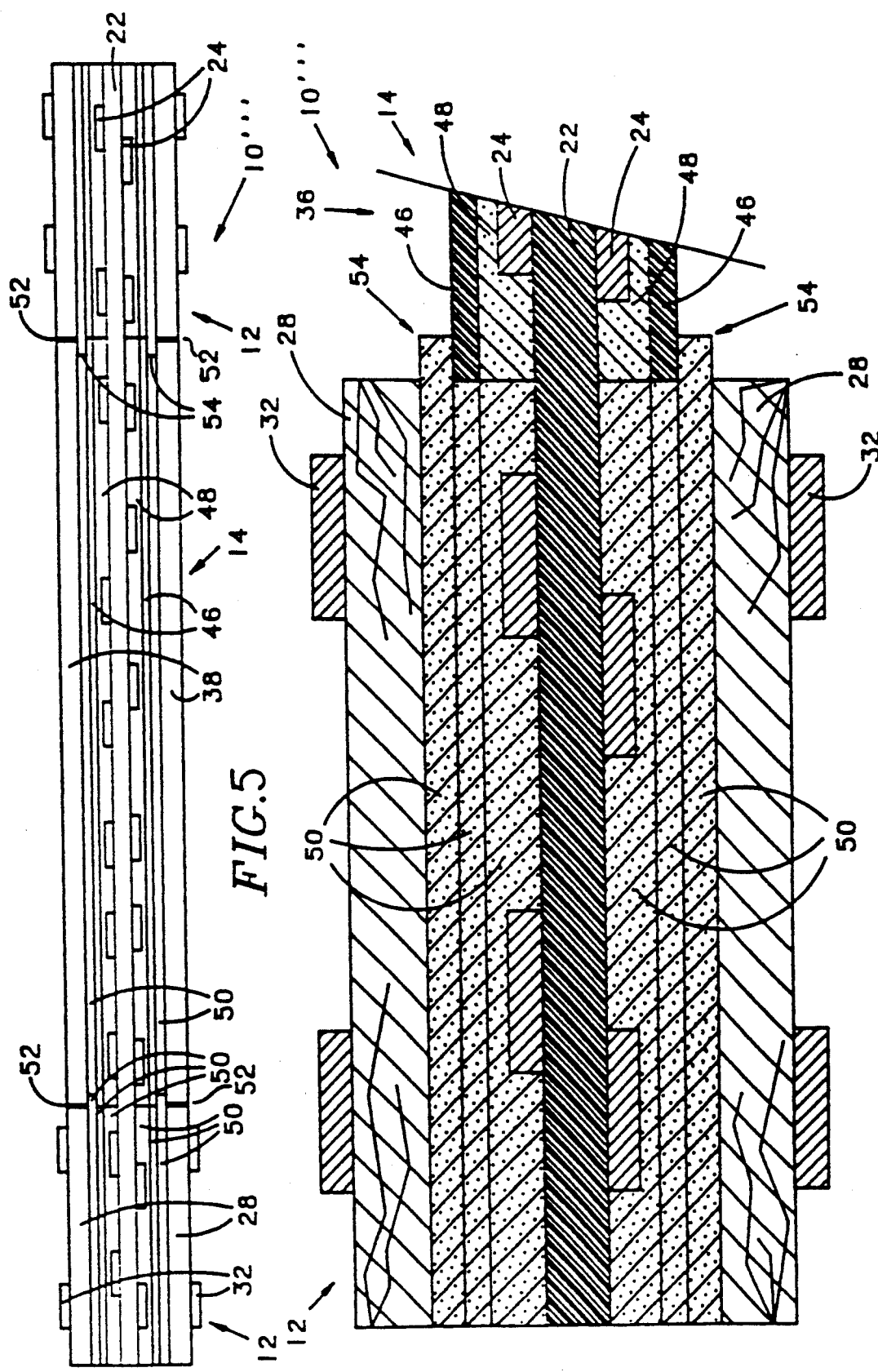

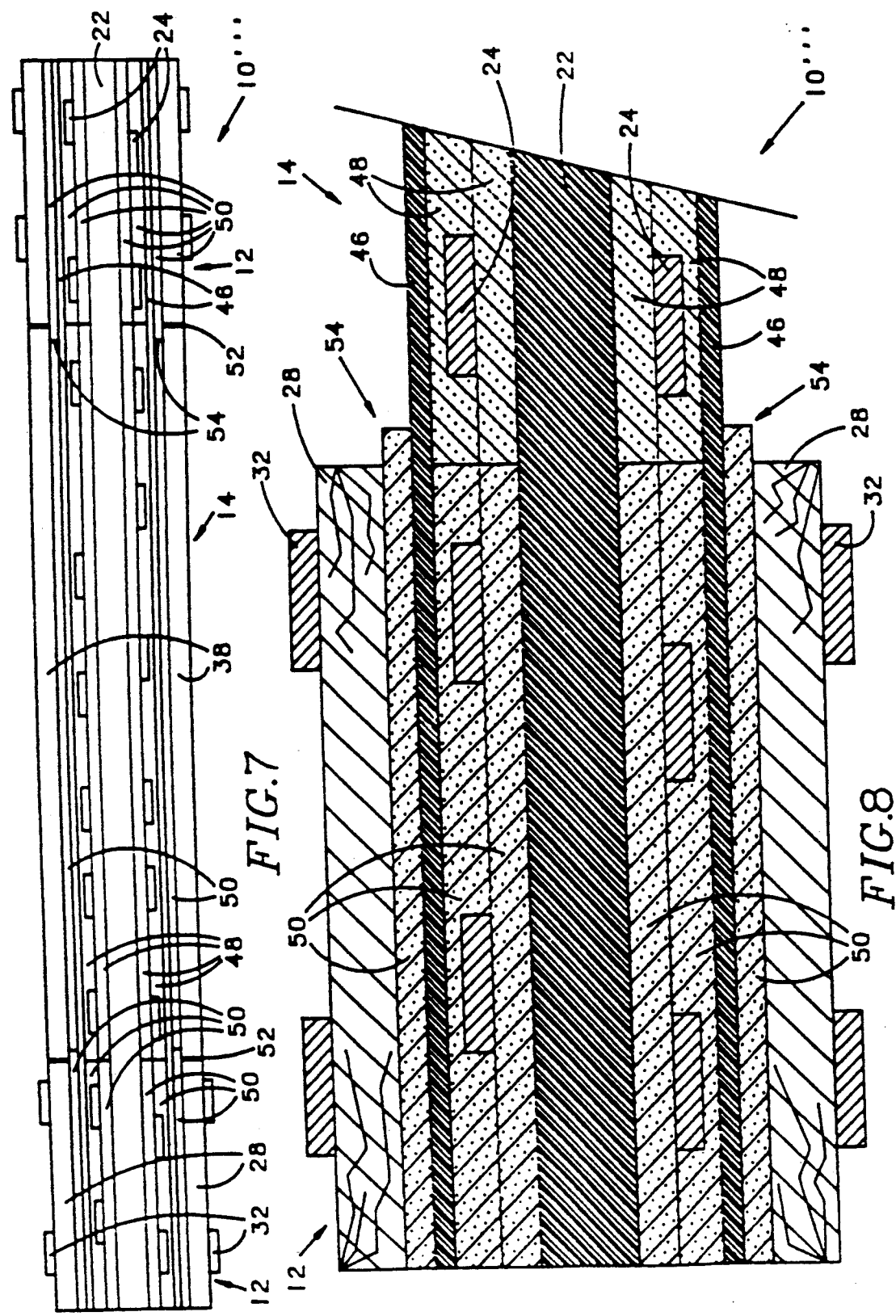

COMBINED RIGID AND FLEXIBLE PRINTED CIRCUITS AND METHOD OF MANUFACTURE

RELATED APPLICATION

This application is a Continuation-in-part of U.S. patent application Ser. No. 07/557,526 filed July 24, 1990.

BACKGROUND OF THE INVENTION

This invention relates to printed circuits and their method of manufacture and, more specifically, to printed circuits comprising multiple layers of circuit elements each having rigid and flexible portions comprising; a sheet of flexible substrate material extending throughout the entirety of the rigid and flexible portions, paths of conductive material carried by at least one side of the sheet of flexible substrate material, and a flexible over-layer material extending over and attached to at least the entirety of all the flexible portions.

The printed circuits to be described hereinafter are generally very thin in cross-section being constructed of multiple layers of film materials (conductive, insulative, and adhesive). In the interest of ease of drawing and understanding only, it should be readily recognized and understood by those skilled in the art that the drawing figures which accompany the written descriptions are not to scale.

Printed circuits combining rigid and flexible portions are known in the art and are popular in many applications, such as automotive and aircraft. Such printed circuits allow modern printed circuit-mounted electronic components to be mounted and interconnected without the need for prior art wiring "harnesses" which were prone to damage, mis-wiring, and the like. As depicted in simplified form in FIG. 1 by way of example, such a combined printed circuit 10 may include several rigid portions 12 interconnected by flexible portions 14. Typically, the rigid portions 12 have components 16 and connectors 18 mounted thereon while the flexible portions 14 provide the interconnecting conductors 20 which replace the wires of the prior art wiring harnesses.

While the first printed circuits were typically a single layer of substrate having conductive portions formed on one or both sides, many printed circuits employed now comprise several conductive layers with the individual layers or elements being adhesively bonded together into a unitary structure. To provide inter-layer electrical connections, aligned holes through the layers (known as vias) are internally plated with a conductive material. Under ideal conditions, the foregoing structure and general method of manufacture presents no problems. Under typical manufacturing conditions, however, various problems present themselves. The result is a diminishing of the yield of the manufacturing process; that is, the various problems to be described shortly result in defects in the resultant printed circuits which make them unreliable and, therefore, unusable. As those skilled in the art are well aware, process yield is a most important factor in electronics manufacturing. Pricing and competitiveness (as well as product quality and reputation) depend on high yields of reliable components and products produced therefrom. Thus, it is of vital importance that the manufacturing processes used to make such multi-layer, combined rigid and flexible printed circuits result in high yields and constantly reliable parts.

Typical prior art approaches to the construction and manufacture of combined rigid and flexible printed circuits can be ascertained by reference to, for example, U.S. Pat. Nos. 4,687,695 and 4,715,928 (Hamby) and 4,800,461 (Dixon et al.). A typical prior art approach and its associated problems is depicted in simplified form in FIG. 2. As with the printed circuit 10 of FIG. 1, there is a multi-layer printed circuit 10' having rigid portions 12 and a flexible portion 14. At the core or center of the circuit 10' there is a substrate 22, usually epoxy-glass, having first conductors 24 formed on the outer surface thereof according to any of the many techniques known to those skilled in the art. The substrate 22 and first conductors 24 are protected on both sides by a flexible overcoating material 26 which is adhesively bonded thereto. The rigid portions 12 are created by attaching a rigid substrate 28 over the conductors and substrate 24, 22 employing a flexible adhesive material 30. The rigid substrate 28 also includes second conductors 32 formed thereon as necessary.

The rigid substrates 28 are typically attached using aligning holes through the various layers (not shown) with the second conductors 32 and the vias (shown in ghost as 34) then being formed in separate manufacturing steps. It is this approach which causes the manufacturing problems leading to reduced yield and reliability mentioned earlier herein. As a result of the thermal shock to which the circuits may be subjected in production and in testing processes, the considerable difference in the coefficients of thermal expansion of the adhesive material 30 relative to the various other materials tends to create voids in the adhesive material 30 and cracking in the conductive plating material in the vias 34. This can cause apparent defects which decrease the yield or, more seriously, latent defects which can cause the final product to fail or malfunction suddenly and unexpectedly at a later time.

Hamby, in both of the aforementioned patents, addresses the problems which result in failure due to thermal stress at plated through bores (vias) in rigid portions of printed circuits also involving flexible portions, by ensuring that, in the rigid portions of the printed circuit which encompass the vias, materials used are conventional rigid circuit board materials rather than the materials used in the flexible portions of the circuit. To this end, Hamby proposes that a sheet of conductive material, or a conductive pattern, be sandwiched between and bonded to sheets of flexible material in the flexible portions of the circuit and to rigid circuit board materials, such as epoxy-glass, in the rigid portions with the sheets of flexible and rigid materials abutting one another at the junctions between the flexible and rigid portions. The resulting structure involves substantial structural weakness at the junction of the flexible and rigid portions, due to the lack of continuity of the structural materials through this junction. At the same time the high rate of thermal expansion of materials such as epoxy-glass relative to the conductive (usually copper) layers results in a significant possibility of cracking and voids being formed particularly when the circuit board is subjected to significant thermal shock as well may occur during the formation of the vias interconnecting the various conductive layers of the circuit. Hamby cites difficulties in forming interconnects between layers of the printed circuit, particularly with the fabrication of the plated through holes, when polyimide materials are used in the region of the interconnects. Hamby does not appear to recognize the problems arising from the significant differences in thermal expansion rates of materials or the significant weakness attending the abutting relation of the materials at the junction between the flexible and rigid portions.

Dixon '461 builds on the teachings of Hamby, by using over-layer sheets slightly overlapping cut outs defining flexible portions of the circuit to reinforce junctions between the flexible and rigid portions. As a result of this, the flexible portions include flexible insulating materials which extend to but not a substantial distance into the rigid portions. Dixon goes to great lengths to avoid any significant presence of flexible materials, such as polyimide, in the rigid portions of the circuit and, in fact, emphasizes the use of epoxy-glass as the printed circuit substrate even in the flexible portions of the circuit referring to the use of a polyimide substrate only for use in flexible portion and only then when the flexible circuit portions need to provide maximum cable flexibility. The reason for this is to avoid the use of flexible materials, such as polyimide, in the rigid portions of the circuit. According to Dixon polyimide substrates, supporting the conductors in the flexible portion, must be terminated at the junction of the flexible and rigid portions with the consequent lack of structural integrity in this region. Dixon states that the use of polyimide in the rigid portions results in problems of thermal expansion and moisture retention and that such problems have been encountered in the past with polyimide materials where acrylic adhesives are used in the rigid portions. Dixon further states that his construction does not contain troublesome materials such as an acrylic adhesive and Kapton (a polyimide film made by E. I. duPont de Nemours and Co. Inc.), which, he states, have high expansion rates and moisture absorption problems. Dixon further states, in the introduction to his application, that the problems he encountered, in the then prior art rigid flex printed circuits incorporating flexible portions and plated through holes interconnecting conductive layers, were created by the thermal expansion of the then typically used insulated materials such as acrylic adhesives and Kapton. He states that failures occur when the board is subjected to elevated temperatures in thermal stress testing, hot oil solder reflow and the like, stating that, in the presence of such adhesives and polyimide materials, the copper in the plated through holes sometimes fractures and that repeated cycles of thermal stress tend to break many of the plated copper barrels formed in the vias of the rigid board section. Dixon also states that if less acrylic adhesive is used to limit expansion, internal stresses developed during lamination procedures cause unacceptable voids or delaminations in the final board. These are highly undesirable as they are, according to Dixon, not apparent until the final stages of construction with a result that costly scrapping of nearly completed boards is frequently required. Dixon attempts to resolve this problem by avoiding the use of acrylic adhesives and polyimide in the rigid portions of his boards, indicating that the use of such material is highly undesirable.

A further approach taken in the prior art which exacerbates the approach taken by Hamby and Dixon is the emphasis on maximizing peel strength between the layers of the circuit in each printed circuit element. This leads to the use of relatively sophisticated adhesives, such as acrylic adhesives, and results in a tendency to place the importance of peel strength above the importance of resistance to thermal shock and structural integrity at the junction between flexible and rigid portions of the circuit assembly.

It is an object of the present invention to provide a structure and a process which is predicated upon a reexamination of the basic parameters required in the effective design and production of printed circuit boards incorporating both flexible and rigid portions with a view to substantially increasing the yield of such structures, with the consequent economic improvement, while substantially eliminating the problems of voids and cracking resulting from thermal shock, maximizing the mechanical integrity of the junction between the flexible and rigid portions of the circuit, and, at the same time, providing an environment in the rigid portions of the circuit assembly for the effective plating-through of vias which will sustain thermal cycling without failure for a sufficient number of cycles to exceed the requirements of government standards in this respect.

It is a further object of the present invention to maximize economies in materials use by maximizing the uniformity of materials extending continuously throughout both the flexible and rigid portions of the circuit element. A secondary object with respect to this is the utilization of such continuous layers to provide effective protection against chemical damage, to existing parts of the circuit, during, for example, the production of the vias and subsequent conductor patterns on rigid parts of the substrate.

SUMMARY OF THE INVENTION

According to a first aspect the present invention provides a printed circuit structure suitable for the formation of a via therethrough to interconnect conductive circuit layers thereof, comprising at least one polyimide substrate, at least two conductive circuit layers carried by said at least one substrate for interconnection by a said via and at least one layer of polyimide prepreg overlying at least the location of said via; the structure consisting substantially solely of a conductive material and polyimide together with glass fiber reinforcement in the polyimide prepreg.

According to a second aspect the present invention provides a printed circuit including a rigid portion and a flexible portion comprising at least one polyimide substrate extending over the entirety of the said rigid portion and the said flexible portion; at least two conductive layers defining paths of conductive material carried by said at least one substrate in both the rigid portion and the flexible portion; a flexible over-layer material extending over at least the entirety of the paths of conductive material in at least the flexible portion; and a rigid material attached to and extending over the entirety of all of the rigid portion.

According to the third aspect the present invention provides a printed circuit, having at least one flexible portion and at least one rigid portion, comprising a plurality of at least partially overlapping circuit elements at least one of which extends to and over at least one said flexible portion and at least one said rigid portion, each circuit element being suitable for the formation of vias therethrough, in said at least one rigid portion, to interconnect conductive circuit layers thereof, and each circuit element comprising at least one polyimide substrate, at least two conductive circuit layers carried by said at least one substrate for interconnection by a said via, at least one layer of polyimide prepreg at least overlying the location of said via and consisting substantially solely of a conductive material and polyimide together with glass fiber reinforcement in the polyimide prepreg; wherein said circuit layers comprise conductive paths in both the rigid and flexible portions and extending therebetween and each substrate extends throughout the entirety of the conductive paths it carries.

According to a fourth aspect the present invention provides a method of assembling a printed circuit comprising multiple conductive layers and rigid and flexible portions, to prevent the formation of voids in adhesive layers thereof and breaks in vias formed therethrough, comprising the steps of starting with a sheet of flexible polyimide substrate material, extending over the entirety of the rigid and flexible portions, with paths of a conductive material on at least one side thereof; disposing a sheet of flexible over-layer material over the entirety of said paths in at least the entirety of all the flexible portions; and attaching a rigid substrate material over the entirety of all the rigid portions.

DESCRIPTION OF THE DRAWINGS

The invention will now be described, by way of example, with reference to the accompanying drawings in which:

FIG. 1 is a simplified plan view of a prior art combined rigid and flexible printed circuit of a type which can be made according to the present invention;

FIG. 2 is an edge view of a portion of a prior art combined rigid and flexible printed circuit at one stage of manufacture and depicting two prior art approaches to protecting the flexible portions during manufacture;

FIG. 3 is an edge view of a portion of a combined rigid and flexible printed circuit according to the present invention in one embodiment thereof at one stage of manufacture and depicting its unique approach to protecting the flexible portions during manufacture while simultaneously improving manufacturing yields by preventing chemical damage, voids in adhesive layers, and damage to through-layer vias in the rigid portions;

FIG. 4 is an enlarged, cutaway view of one rigid portion and an adjacent part of the flexible portion of the combined rigid and flexible printed circuit of FIG. 3 after manufacture;

FIG. 5 is an edge view of a portion of a combined rigid and flexible printed circuit according to the present invention in a second embodiment thereof at one stage of manufacture;

FIG. 6 is an enlarged, cutaway view of one rigid portion and an adjacent part of the flexible portion of the combined rigid and flexible printed circuit of FIG. 5 after manufacture;

FIG. 7 is an edge view of a portion of a combined rigid and flexible printed circuit according to the present invention in a third embodiment thereof at one stage of manufacture;

FIG. 8 is an enlarged, cutaway view of one rigid portion and an adjacent part of the flexible portion of the combined rigid and flexible printed circuit of FIG. 7 after manufacture;

FIG. 9 is a cut away view of one rigid portion and an adjacent part of a flexible portion of a fourth embodiment of the present invention;

FIG. 10 is a cut away view of one rigid portion and an adjacent part of the flexible portion of a fifth embodiment of the present invention; and FIG. 11 is a side elevation of an exemplary multiple layer printed circuit construction incorporating a plurality of, for example, one or more circuit elements according to the first through fifth embodiments of the present invention.

DESCRIPTION OF THE PREFERRED EMBODIMENT

A printed circuit 10''' according to the invention in one embodiment is shown in edge view in FIG. 3 and one end of this is shown enlarged and cutaway in FIG. 4. A second embodiment is similarly shown in FIGS. 5 and 6, a third in FIGS. 7 and 8, a fourth in FIG. 9 and a fifth on FIG. 10. Again, for ease of comparison and understanding, elements of the printed circuits 10''' which are common to the and printed circuit 10' of FIG. 2 are designated with common numbers. As will be appreciated from the descriptions of the various embodiments of the present invention contained hereinafter, the common element and major point of novelty is the use of a polyimide substrate throughout the rigid and flexible portions.

With reference first to the embodiment of FIGS. 3 and 4, there is provided a flexible substrate 22, having first conductors 24 formed on the outer surfaces thereof, at the core or center. The substrate in this embodiment is a polyimide sheet. The substrate 22 and first conductors 24 are protected throughout, on both sides, by flexible, polyimide film, over-layers 46 bonded thereto with a flexible adhesive 48, e.g. an acrylic adhesive, in the flexible portions 14 and a rigid adhesive 50, e.g. a polyimide prepreg (glass fiber reinforced polyimide sheets) in the rigid portions 12. The rigid portions 12 comprise a rigid substrate 28 including second conductors 32 formed thereon as necessary. The rigid substrate 28 is attached to the over-layers 46 with the rigid adhesive material 50, e.g. a polyimide prepreg, and the blocking portions 38 fill the windows 36 these being held in place by their connection to the remainder of the substrate 28 at the location of grooves 52 which facilitate later removal of the portions 38. During manufacture the fiber glass reinforced adhesive material layers 50 which attach the substrates 28 to the over-layers 46 extend under the blocking portions 38 throughout the windows 36. A release coating is provided between the layers 50 and the over-layers 46 to facilitate removal of the blocking portions 38 and the immediately underlying adhesive 50 after manufacture. Note in particular in the enlarged view of FIG. 4 that the rigid adhesive material 50 used to attach the substrate 28 to the over-layer 46 extends out slightly from the edge of the rigid substrate 28 adjacent the flexible portion 14. This extended portion 54 can be straight along its inner edge as depicted or, if desired, can be angled back towards the substrate 28. It can also be formed of a single layer of the adhesive material 50 or of multiple layers. Thus, during any subsequent chemical steps of the manufacturing process, there is complete protection by the substrate 28 including portions 38 and by over-layers 46.

To facilitate removal of the adhesive 50 in the windows, the layer 50 is cut after lamination at the inner extension of the extended portions 54. The extended portions 54 act, in use, as stress relievers of the area of the circuit structure at junctions between rigid and flexible portions thereof. When the manufacturing process is complete and the chemicals have been washed from the completed printed circuit 10'''' the blocking portions 38 and the adhesive 50 within the windows 36 are easily removed without damage to the underlying portions of the flexible portion 14. Moreover, since the rigid substrates 28 are attached to the over-layers 46 with the rigid adhesive material 50, there is no excessive thermal expansion of the adhesive material 50 during the subsequent testing steps and, therefore, no voids are formed and no cracking takes place in the plating material of the vias 34.

The circuit element 11 of this embodiment is illustrative of one layer element of multiple-layer rigid flex circuits within the scope of this invention.

The embodiment of FIGS. 5 and 6 is substantially the same as that of FIG. 3 and 4 with one exception. The polyimide over-layers 46 extend only over the windows 36 that comprise the flexible portions 14 of the final printed circuit 10'''. The portion of the layer not including the over-layer therein under the substrate 28 comprises an additional quantity (or layer(s)) of the rigid adhesive 50 (again preferably polyimide prepreg). Thus, in this embodiment, with the exception of the flexible polyimide substrate 22 at its center, the entirety of the rigid portion 12 is comprised of rigid materials.

Similarly, the embodiment of FIGS. 7 and 8 is substantially the same as that of FIG. 3 and 4 also with one exception. The first conductors 24 are separate and attached to the flexible substrate 22 employing a layer of the rigid adhesive 50, e.g. a polyimide prepreg in the rigid portions 12 and flexible adhesive 48, e.g. an acrylic adhesive, in the flexible portions 14 rather than being formed directly on the surface of the substrate 22. As those skilled in the art will readily recognize and appreciate, while not specifically depicted, a further embodiment could be made according to the present invention by combining the exceptions of FIGS. 5 and 6 with those of FIGS. 7 and 8 to have the over-layers 46 extend only over the windows 36 that comprise the flexible portions 14 of the final printed circuit 10''' and having the first conductors 24 separate and attaching them to the flexible substrate 22 employing a layer of the rigid adhesive 50 throughout.

FIGS. 9 and 10 relate to an embodiments in which the circuit element 11 consists primarily of a binary material system, namely a conductive material and polyimide. In both of these embodiments polyimide sheet substrate 22 extends throughout the rigid and flexible portions 12, 14 of the circuit element with copper conductors 24 adhesivelessly attached to both faces thereof. This polyimide substrate 22 with its conductors 24 is coated on both sides with a polyimide adhesive layer 49, again throughout both the rigid and flexible portions of the circuit assembly 11. That adhesive 49 is used to attach a polyimide sheet over-layer 46 to both faces of the conductor-substrate combination with these over-layers 46 terminated, in the embodiment of FIG. 9, at the junction of the rigid and flexible portions 12, 14 and with the over-layers 46, in the embodiment shown in FIG. 10, extending throughout both the rigid and flexible portions 12, 14.

In the embodiment of FIG. 9 the structure of the rigid portion 12 is completed by a plurality of layers of polyimide prepreg 50 attached to the conductor substrate structure by the polyimide adhesive 49 in the rigid portion 12.

In the embodiment of FIG. 10 multiple layers of polyimide prepreg 50 are bonded to the over-layers 46 in the rigid portion 12 of the circuit. In both embodiments vias 34 interconnect circuit conductors as desired in the rigid portion 12.

Thus it can be seen that the circuit element 11 of both the embodiment of FIG. 9 and of FIG. 10 consist of only copper and polyimide with a minor addition of glass fiber reinforcement in the polyimide prepreg areas. The conductor-substrate structure 22, 24 is an adhesiveless structure which may be manufactured, for example, by plating copper onto a polyimide sheet, casting a polyimide substrate onto a copper sheet (this produces a single sided circuit, two of which may be bonded back-to-back to produce a two-sided circuit). Any adhesive used to produce double-sided circuits would in this system, preferably be a polyimide adhesive. Additionally, one or two sided circuit structures could be produced by using a polyimide adhesive to attach the copper conductors to a polyimide sheet substrate.

In the embodiments described with reference to FIGS. 9 and 10, layers of polyimide adhesive are used to attach over-layers 46 and polyimide prepreg layers 50 to the underlying structure. It will, however, be appreciated that polyimide over-layers 46 and the polyimide prepreg 50 could be bonded, without a separate adhesive, to the underlying structures, for example, by applying suitable pressures and temperatures to the polyimide over-layers and prepreg layers, while in a suitable partially cured condition, after assemble of the element 11.

Referring now to FIG. 11 there is illustrated the printed circuit construction consisting of three circuit elements in a stacked array, the circuit elements being interconnected in the rigid portion 12 by polyimide prepreg 50 which serves to space the elements apart, the elements not being connected together in the flexible portion 14. The outer surfaces of the multiple layer circuit structure in the rigid portions carries a rigid polyimide substrate material 28 adhesively attached to the outer surfaces of the outer elements by polyimide prepreg 50 which as with other embodiments of this invention extends slightly into the flexible portion to reinforce the circuit structure at this junction. It will be appreciated that this arrangement is purely exemplary and that in typical and practical multiple layer circuit structures the number of circuit elements 11 which may be utilized is substantially unlimited.

It will be appreciated that while the polyimide over-layers 46 have been referred to as polyimide sheets, these layers could in fact be cast in place. Further rigid material 28 could be one or more layers of polyimide prepreg adhesivelessly or adhesively interconnected.

The use of only polyimides, including film and polyimide prepreg, with copper in the rigid portions of the circuits results in a structure in this rigid portion in which, over the temperature ranges to which the structure will be exposed, the Thermal Co-efficient of Expansion (TCE) in parts per million per degrees per centigrade ppm/° c., is a ratio from copper conductors at 17 to polyimide at 60 to 80 (namely a ratio between 1:3.5 and 1:4.7) as compared with a structure utilizing epoxy-glass prepreg which has a TCE of 200 to 225 (providing TCE ratios of between 1:11.8 and 1:13.2). While the copper polyimide binary construction results in a somewhat lower peel strength between layers, it has been found that the peel strength is in fact entirely adequate while at the same time the significant reduction in TCE ratios reduces the effects of thermal shock and substantially eliminates the formation of voids and cracks resulting from such shock thereby providing a significant improvement in yield in rigid flex circuits contrary to the teaching of the prior art. While the disclosure has been made with primary reference to the use of copper and polyimides, it will be appreciated that other materials (usually polymers) may as well prove useful. It is, however, indicated that the range of TCE's for materials used in at least the rigid portions of the circuit structure in which vias are to be formed should comprise material having TCE ratios not exceeding 1:10 and preferably not exceeding 1:5.

Suitable polymeric materials, in the rigid portions, should have Glass Transition Temperatures (Tg) of about 100° C. or more (preferably about 120° C. or more) and a TCE in the temperature range of 20° C. to 287° C. of about 400 ppm/° C. or less (preferably about 250 ppm/° C. or less).

In the preferred implementation of the present invention in its various embodiments as described above, the preferred material for the rigid substrate 28 is a polyimide prepreg, however an epoxy prepreg could be used even though the result would be an inferior product. The preferred over-layer 46 is a polyimide film such as sold under the trademarks Kapton, Upilex, and Apical. The preferred flexible adhesive 48 is an acrylic adhesive or similar flexible polymer.

The presently preferred of the various embodiments described above consists of a central substrate of Kapton or other polyimide film coextensive throughout the rigid and flexible portions with copper conductors on either or both surfaces thereof and with polyimide overlayers bonded thereto by a flexible adhesive material such as duPont Pyralux in the flexible areas and a rigid adhesive material such as Hitachi Chemical GIA-67N prepreg or Arlon 37N in rigid areas. This construction provides all-flexible materials in flexible areas and virtually all-rigid materials in rigid areas. The "virtual" limitation in the rigid areas is the polyimide film which, while actually flexible, is a low thermal-expansion, high modulus material with a high $T_c$ and, therefore, acts like the rigid materials with respect to the thermal expansion problem described earlier herein.

"Bonded" as used herein means being physically attached and includes, but is not restricted to, chemical bonding, welding, uniting through the medium of an adhesive, cement etc., fusing together.

Thus, it can be seen that all the objectives for a multi-level printed circuit combining rigid and flexible portions as stated above are met by the present invention.

We claim:

1. A printed circuit structure having rigid and flexible portions having a via through a rigid portion thereof to interconnect conductive circuit layers thereof, comprising:
    a) a least one polymeric substrate;
    b) at least two conductive circuit layers carried by said at least one substrate for interconnection by said via;
    c) at least one layer of polymeric prepreg overlying at least the location of said via; and
    d) a sheet of flexible polymeric over-layer material extending over the paths of conductive material in at least the entirety of all the flexible portion in a manner to prevent exposure of at least the conductive paths to the environment;
    e) said polymeric materials in the rigid portion having a TCE of no more than about 400 ppm/° C. over a temperature range of 20° C. to 287° C.

2. A printed circuit structure according to claim 1 in which said polymeric materials in the rigid portion have a Tg of at least about 100° C.

3. A printed circuit structure according to claim 2 in which said polymeric materials in he rigid portion have a Tg of at least about 120° C. and a TCE of no more than about 250 ppm/° C. over the specified temperature range.

4. A printed circuit structure having a rigid and a flexible portion comprising:
    a) a sheet of flexible, polyimide, substrate material extending over the entirety of the rigid and flexible portions;
    b) a path of conductive material carried by at least one side of said sheet of flexible substrate material in both the rigid and flexible portions; and
    c) a sheet of flexible polymeric over-layer material extending over the path of conductive material in at least the entirety of all the flexible portion in a manner to prevent exposure of at least the conductive path in the flexible portion to the environment;
    d) the structure being at least partially superimposed onto at least one further such structure, the structures being interconnected in their rigid portions;
    e) the plurality of superimposed structures further comprising a layer of polymer prepreg overlying both opposed faces of said plurality at least at the location of a via, formed in the rigid portions, to define the ends of the via; and wherein
    f) the polymers in the rigid portion of the structure have a TCE of no more than about 400 ppm/° C. over a temperature range of from 20° C. to 287° C.

5. A printed circuit structure according to claim 4 wherein the over-layer material is attached to both the path of conductive material and the substrate material by an adhesive.

6. A printed circuit structure according to claim 4 wherein the over-layer material extends over the entirety of both the rigid and flexible portions.

7. A printed circuit structure according to claim 4 wherein the over-layer material is polyimide.

8. A plurality of superimposed structures according to claim 4 wherein the structures are not connected together in their flexible portions.

9. A plurality according to claim 4 wherein the rigid portions are attached together by at least one of an polymeric adhesive and a polymer prepreg.

10. A plurality according to claim 9 wherein the adhesive is a polyimide adhesive and the polymer is polyimide.

11. A plurality according to claim 4 wherein the polymer prepreg is a polyimide prepreg.

12. A printed circuit structure according to claim 4 wherein said polymers in the rigid portion have a Tg of at least 100° C.

13. A printed circuit structure to claim 4 wherein said TCE is no more than 250 ppm/° C. over said temperature range.

14. A printed circuit structure according to claim 12 wherein said Tg is at least 120° C.

15. A printed circuit structure according to claim 4 wherein a path of conductive material is formed on each of both sides of said substrate material and a sheet of said flexible polymeric over-layer material extends over at least the entirety of both sides of at least the flexible portion in a manner to prevent exposure of at least the conductive paths on both sides of the flexible portion to the environment.

16. A plurality according to claim 15 wherein said at least one further such structure having a rigid and a flexible portion comprises:
  a) a sheet of flexible, polyimide, substrate material extending over the entirety of the rigid and flexible portions;
  b) a path of conductive material carried by at least one side of said sheet of flexible substrate material in both the rigid and flexible portions; and
  c) a sheet of flexible polymeric over-layer material extending over the paths of conductive material in at least the entirety of all the flexible portion in a manner to prevent exposure of at least the conductive path to the environment, the structures being interconnected in their rigid portions by means of a polymeric material.

17. A method of assembling a printed circuit comprising multiple circuit layers and rigid and flexible portions, to prevent the formation of voids in adhesive layers thereof and breaks in vias formed therethrough, comprising the steps of:
  a) starting with a sheet of flexible polyimide substrate material extending over the entirety of the rigid and flexible portions; with paths of a conductive material on at least one side thereof;
  b) disposing a sheet of flexible polymeric over-layer material over at least the entirety of all of the flexible portion in a manner to prevent exposure of at least the paths of conductive material in the flexible portion to the environment;
  c) disposing a rigid polymeric substrate material over the entirety of all the rigid portions;
  d) disposing the sheet of flexible polymeric over-layer material over the entirety of at least all paths of conductive material in the rigid portions; and,
  e) adhesively attaching the sheet of flexible polymeric over-layer material to the polyimide substrate in both the rigid portion the flexible portion and the conductive material it carries, the adhesive in the rigid portion being polymeric adhesive material; wherein
  f) the polymeric materials in the rigid portions have a TCE of no more than about 400 ppm/° C. over a temperature range of 20° C. to 287° C.

18. A method according to claim 17 wherein the polymeric materials in the rigid portions have a Tg of at least about 100° C.